US008963671B2

(12) United States Patent
Chen et al.

(10) Patent No.: US 8,963,671 B2
(45) Date of Patent: Feb. 24, 2015

(54) SEMICONDUCTOR TRANSFORMER DEVICE AND METHOD FOR MANUFACTURING THE SAME

(75) Inventors: Chi-Han Chen, Kaohsiung (TW); Pao-Nan Lee, Kaohsiung (TW); Chi Tsung Chiu, Kaohsiung (TW); Chien Hua Chen, Pingtun (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 13/601,999

(22) Filed: Aug. 31, 2012

(65) Prior Publication Data

US 2014/0062641 A1 Mar. 6, 2014

(51) Int. Cl.
*H01F 27/28* (2006.01)
*H01F 5/00* (2006.01)

(52) U.S. Cl.
USPC ............................ 336/182; 336/200; 336/232

(58) Field of Classification Search
USPC .......................... 336/200, 223, 232, 182, 188
See application file for complete search history.

(56) References Cited

U.S. PATENT DOCUMENTS

| | | | | |
|---|---|---|---|---|
| 3,904,991 | A * | 9/1975 | Ishii et al. | 333/116 |
| 4,816,784 | A * | 3/1989 | Rabjohn | 333/24 R |
| 6,794,977 | B2 * | 9/2004 | Christensen | 336/200 |
| 6,961,231 | B1 | 11/2005 | Alexander et al. | |
| 7,388,439 | B2 | 6/2008 | Smolders et al. | |
| 7,557,423 | B2 | 7/2009 | Ching et al. | |
| 7,633,165 | B2 | 12/2009 | Hsu et al. | |
| 7,821,372 | B2 * | 10/2010 | Ho-Hsiang | 336/200 |
| 8,067,816 | B2 | 11/2011 | Kim et al. | |
| 8,093,982 | B2 | 1/2012 | Kim et al. | |
| 2004/0056749 | A1 * | 3/2004 | Kahlmann et al. | 336/200 |
| 2005/0134419 | A1 | 6/2005 | Furumiya et al. | |
| 2006/0077028 | A1 * | 4/2006 | Huang | 336/223 |
| 2009/0039999 | A1 * | 2/2009 | Fujii et al. | 336/200 |
| 2011/0050357 | A1 | 3/2011 | Kim et al. | |
| 2011/0084765 | A1 | 4/2011 | Kim et al. | |
| 2011/0291786 | A1 | 12/2011 | Li et al. | |
| 2011/0316657 | A1 | 12/2011 | Park et al. | |
| 2012/0001297 | A1 | 1/2012 | Kim et al. | |

FOREIGN PATENT DOCUMENTS

JP 2009-64963 3/2009

OTHER PUBLICATIONS

Japan Patent Office, Search Report for ROC (Taiwan) Patent Application No. 102116223, Jun. 16, 2014 (translation). Note that U.S. Pat. No. 67949772 is cited in the search report. Applicant believes that this a reference to U.S. Pat. No. 6,794,977, which was previously submitted in an IDS in the present application.
Japan Patent Office, Office Action for ROC (Taiwan) Patent Application No. 102116223, Jun. 16, 2014.

* cited by examiner

*Primary Examiner* — Mangtin Lian
(74) *Attorney, Agent, or Firm* — Foley & Lardner LLP; Cliff Z. Liu; Angela D. Murch

(57) ABSTRACT

A semiconductor transformer includes a first coil inductor and a second coil inductor. The first coil inductor has a first port, a second port and a first coil inductor wall, the first coil inductor wall having a height substantially equal to a thickness of the substrate. The second coil inductor has a third port, a first extension wall connected to the third port, a fourth port, a second extension wall connected to the fourth port and a second coil inductor wall.

13 Claims, 12 Drawing Sheets

SEMICONDUCTOR TRANSFORMER DEVICE AND METHOD FOR MANUFACTURING THE SAME

BACKGROUND

1. Field of Invention

The present invention relates to a semiconductor transformer. More particularly, the present invention relates to a high power semiconductor transformer.

2. Description of Related Art

A transformer can transmit energy from one circuit to another circuit via electromagnetic coupling. A transformer can, among its many uses, transform a voltage, change effective impedance of a circuit, and isolate one circuit from another.

In recent years, it has become desirable to incorporate transformers into integrated circuits. For example, in a complementary metal-oxide semiconductor (CMOS) integrated circuit, the transformer may be configured as a planar structure, and the metal layer thickness of the transformer is in the range of 3-10 μm. However, the metal layer thickness may not be able to conduct large current with good thermal dissipation for high power applications. To meet the high current handling requirement, trace width may be increased, but the increased trace width also takes up valuable footprint area and increases the transformer size to a point where the transformer is too large to meet goals of high integration.

SUMMARY

In one embodiment, a semiconductor transformer includes a first coil inductor and a second coil inductor. The first coil inductor has a first port, a second port and a first coil inductor wall, the first coil inductor wall having a height substantially equal to a thickness of the substrate. The second coil inductor has a third port, a first extension wall connected to the third port, a fourth port, a second extension wall connected to the fourth port and a second coil inductor wall.

Another aspect of the disclosure relates to a semiconductor transformer device comprising a substrate, an isolation block embedded in the substrate, a first coil inductor including a first terminus, a second terminus and a first coil inductor panel, and a second coil inductor disposed in a spaced relationship relative to the first coil inductor, the second coil inductor including a third terminus, a first extension panel connected to the third terminus, a fourth terminus, a second extension panel connected to the fourth terminus and a second coil inductor panel, wherein at least one of the first coil inductor and the second coil inductor is embedded in the isolation block.

Another aspect of the disclosure relates to manufacturing method, comprising providing a substrate including a plurality of trenches; forming a plurality of metal rails within the trenches; forming a plurality of gaps along junctions between the trenches and the metal rails; forming a first insulation layer over the substrate, the material of the first insulation layer at least partially filling the gaps; forming a second insulation layer over the substrate, the second insulation layer having at least one first opening; and forming a first metallic layer over the second insulation layer and extending into the first opening of the second insulation layer.

BRIEF DESCRIPTION OF THE DRAWINGS

Common reference numerals are used throughout the drawings and the detailed description to indicate the same elements.

The present invention will be more apparent from the following detailed description taken in conjunction with the accompanying drawings.

DETAILED DESCRIPTION

Figure 1A:
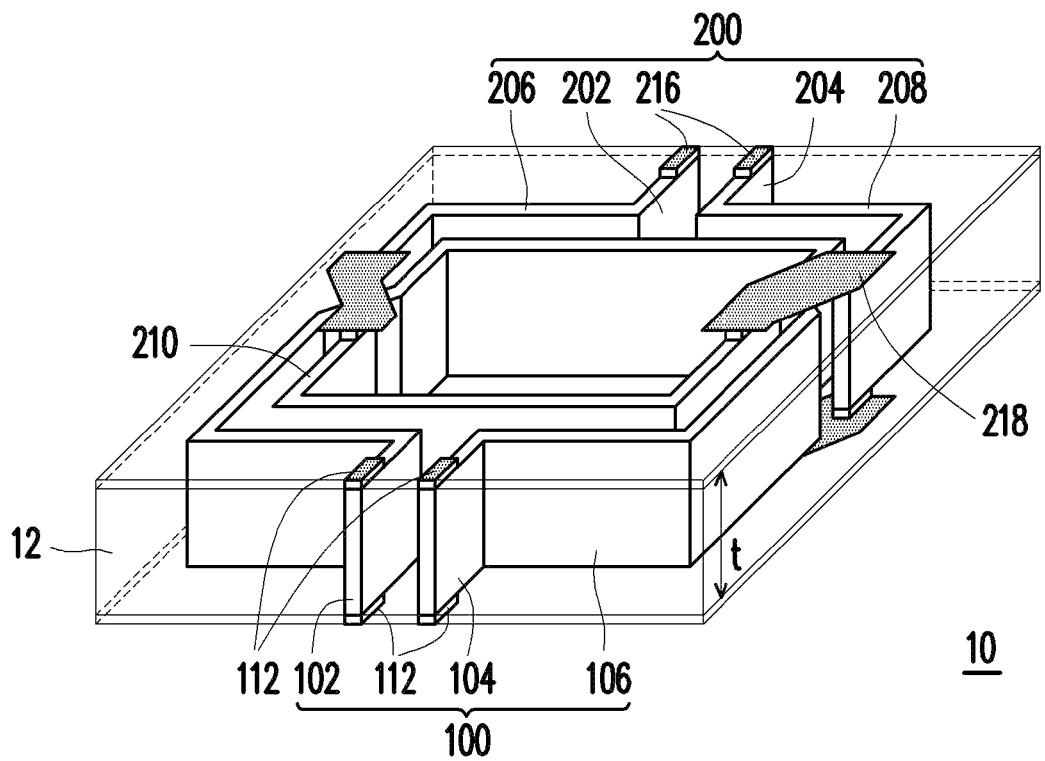
FIG. 1A illustrates a three-dimensional perspective view of a semiconductor transformer according to one embodiment.

Referring to FIG. 1A, a three-dimensional view of a semiconductor transformer 10 according to one embodiment is illustrated. The semiconductor transformer 10 includes a substrate 12, a first coil inductor 100 and a second coil inductor 200.

The substrate 12 may be comprised of silicon or other semiconductor material. The elements of the semiconductor transformer 10, as shown in the present embodiment, will be formed on or within the substrate 12. The substrate 12, as well as the semiconductor transformer 10, may be a standalone device or alternatively may be a component of a more complex integrated circuit which shares a common substrate.

The first coil inductor 100 includes at least one first port 102, at least one second port 104, and a first coil 106 having one end connected the first port 102 and another end connected to the second port 104. Each port 102 or 104 may be located adjacent to a terminus, or end portion of the first coil inductor 100. A first conductive layer with conductive elements 112 is disposed on the upper and lower surfaces of the first port 102 and the upper and lower surfaces of the second port 104. The first coil 106 as illustrated in FIG. 1A is a contiguous electrically conductive channel disposed within the substrate 12 and interlaced with, but without physically contacting, the second coil inductor 200. Discrete coil segments are also contemplated for the first coil 106.

The second coil inductor 200 includes at least one third port 202, three coil segments 206, 208 and 210, and at least one fourth port 204. A second conductive layer 216 is disposed on the upper and lower surfaces of the third port 202 and the upper and lower surfaces of fourth port 204. A first segment 206 is connected to the third port 202. A second segment 210 is discrete from the first segment 206. The first segment 206 and the second segment 210 are electrically connected by a conductive element 218, which serves to bridge the first coil inductor 100 without making physical contact with the first coil inductor 100. The second coil inductor 200 further comprises a third segment 208 that is discrete from the first segment 206 and second segment 210. The second segment 210 and the third segment 208 are electrically connected by a conductive element 218, which also serves to bridge the first coil inductor 100 at another location within the substrate 12 without making physical contact with the first coil inductor 100. The third segment 208 is electrically connected to the fourth port 204.

The second segment 210 of the second coil inductor 200 is located within the periphery of, or interior to, the first coil 106. The first segment 206 and the third segment 208 are located outside the periphery of, or exterior to, the first coil 106, and are partially surrounding the first coil 106. The first and third segments 206 and 208 are separated from the second segment 210 by the first coil 106. The heights of the first coil inductor 100 and second coil inductor 200 are substantially the same as the thickness "t" of the substrate 12.

As illustrated in FIG. 1A, the first coil inductor 100 and the second coil inductor 200 may be formed such that at least portions of the first coil inductor 100 and the second coil inductor 200 are in the form of contiguous panels. As also illustrated in FIG. 1A, the top and bottom surfaces of the panels of coil inductors 100 and 200 may be substantially co-planar with the top and bottom, respectively, of the substrate 12. Thus, the panels illustrated in the embodiment of FIG. 1A form partitions (or walls) between areas of the substrate 12. An inductor such as the coil inductor 100 illustrated in FIG. 1A with a single contiguous panel and a terminus at each end of the panel may be referred to herein as having a coil inductor panel, partition, or wall. An inductor such as coil inductor 200 with multiple segments may be referred to herein as having a coil inductor panel, partition, or wall and one or more extension panels, partitions, or walls electrically connected to the coil inductor panel, partition, or wall through conductive elements similar to conductive element 218. Although illustrated as straight panels, one or more of the panels may instead include curved portions. For example, an inductor coil such as inductor coil 100 may be formed as a ring-shaped structure with an opening between ports.

While a 1:1 transformer has been described and illustrated with reference to a specific embodiment, these descriptions and illustrations are not limiting. The transformer may alternatively be a 1:N transformer (N is coil number and can be 2, 3, 4, 5 . . . ) wherein the 1:N ratio represents the turns ratio of the first coil inductor 100 to the second coil inductor 200 based on the ideal transformer equation shown in Equation (1), wherein Vs, Ns, and Is are the voltage, turns, and current, respectively, of the transformer secondary coil inductor, and Vp, Np, and Ip are the voltage, turns, and current, respectively, of the transformer primary coil inductor.

$$\frac{Vs}{Vp} = \frac{Ns}{Np} = \frac{Ip}{Is} \qquad \text{Equation (1)}$$

This formula provides the voltage and current transformation or impedance transformation between the first coil inductor 100 and the second coil inductor 200.

Figure 1B:
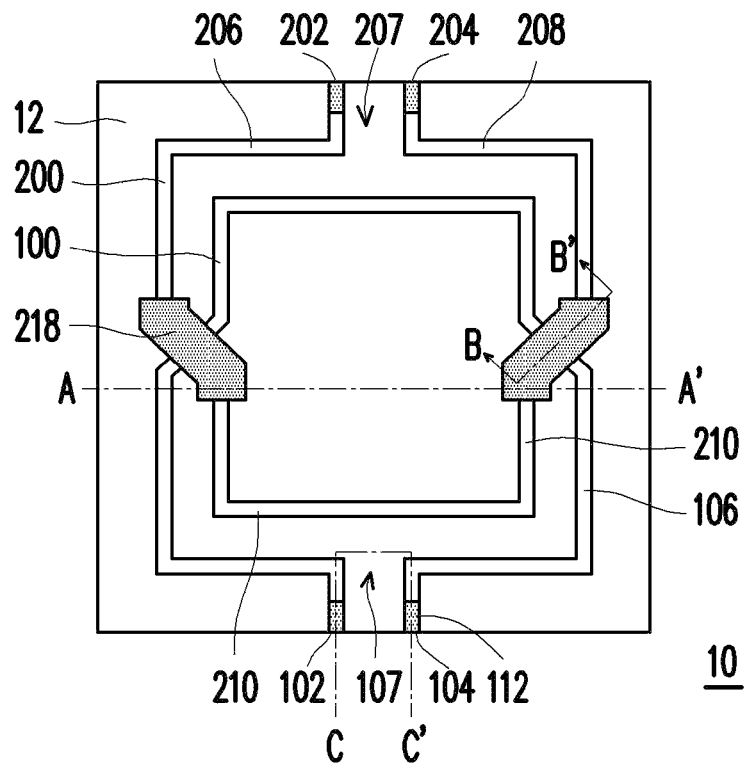
FIG. 1B illustrates a top view of FIG. 1A.

Referring to FIG. 1B, a top view of FIG. 1A is illustrated. The first coil inductor 100 has a gate opening 107 disposed between the first port 102 and the second port 104. The second coil inductor 200 has a gate opening 207 disposed between the third port 202 and the fourth port 204. The first segment 206 and third segment 208 are connected to the second segment 210 by the conductive elements 218. The width of the conductive elements 218 may be larger than the widths of the segments 206, 208 and 210. Alternatively, the width of the conductive elements 218 may be substantially the same as the width of the second coil inductor 200. While the first coil inductor 100 has been described and illustrated as a continuous inductor, this is not limiting The first coil inductor 100 may alternatively be at least two separated portions electrically connected by a conductive element.

Figure 1C:
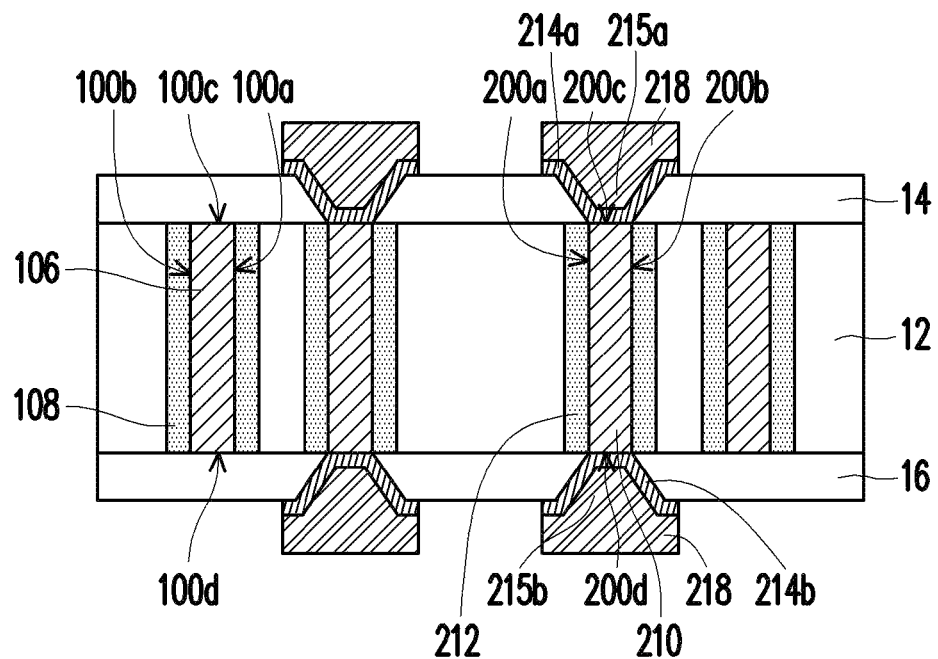
FIG. 1C illustrates a cross-sectional view along line A-A' of FIG. 1B.

Referring to FIG. 1C, a cross-sectional view along line A-A' of FIG. 1B is illustrated. An upper insulation layer 14 is disposed on an upper surface 200c of the second coil inductor 200 and a lower insulation layer 16 is disposed on a lower surface 200d of the second coil inductor 200. At least one opening 215a is formed in the upper insulation layer 14 and at least one opening 215b is formed in the lower insulation layer 16. An upper metallic layer 214a covers the opening 215a of the upper insulation layer 14 and a lower metallic layer 214b covers the opening 215b of the lower insulation layer 16. The conductive elements 218 are disposed on the upper metallic layer 214a and the lower metallic layer 214b. The conductive elements 218 are electrically connected to the upper metallic layer 214a and the lower metallic layer 214b.

An inner sidewall 100a and an outer sidewall 100b of the first coil inductor 100 are covered with an insulating layer 108, so that the first coil inductor 100 is isolated from the substrate 12 by the insulating layer 108. Similarly, an inner sidewall 200a and an outer sidewall 200b of the second coil inductor 200 are covered with an insulating layer 212, so that the second coil inductor 200 is isolated from the substrate 12 by the insulating layer 212. The second segment 210 is located inside of the first coil 106.

Figure 1D:
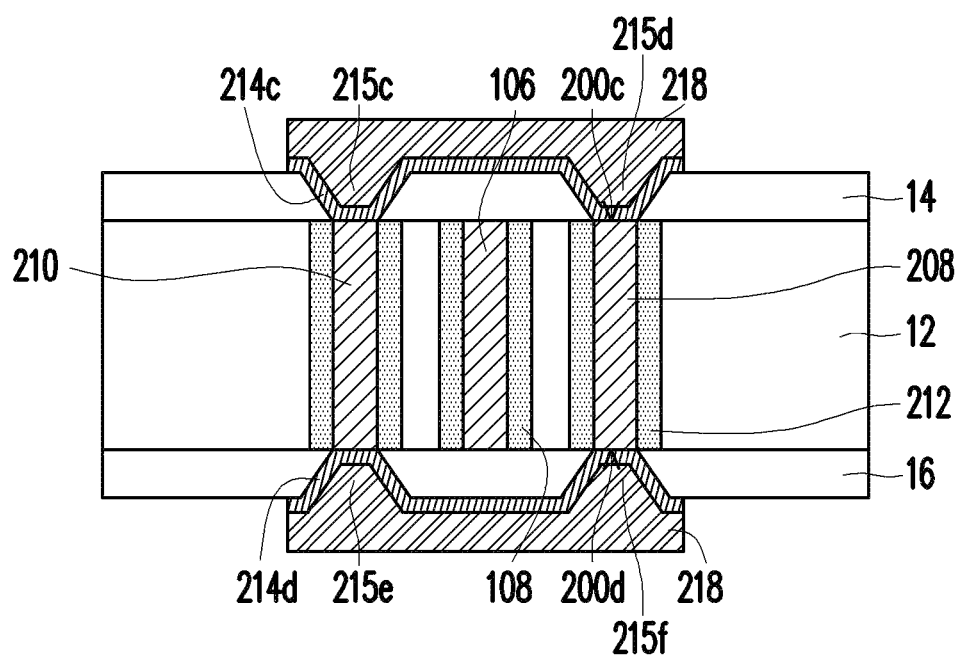
FIG. 1D illustrates a cross-sectional view along line B-B' of FIG. 1B.

Referring to FIG. 1D, a cross-sectional view along line B-B' of FIG. 1B is illustrated. The upper insulation layer 14 is disposed on the upper surface 200c of the second coil inductor 200 and the lower insulation layer 16 is disposed on the lower surface 200d of the second coil inductor 200. At least one opening 215c and at least one opening 215d are formed in the upper insulation layer 14. At least one opening 215e and at least one opening 215f are formed in the lower insulation layer 16. An upper metallic layer 214c covers the opening 215c and the opening 215d of the upper insulation layer 14. A lower metallic layer 214d covers the opening 215e and the opening 215f of the lower insulation layer 16. The conductive elements 218 are disposed on the upper metallic layer 214c and the lower metallic layer 214d. In addition, the conductive elements 218 are electrically connected to the upper metallic layer 214c and the lower metallic layer 214d. The conductive elements 218 bridge the first coil 106 without making electrical contact.

Figure 1E:
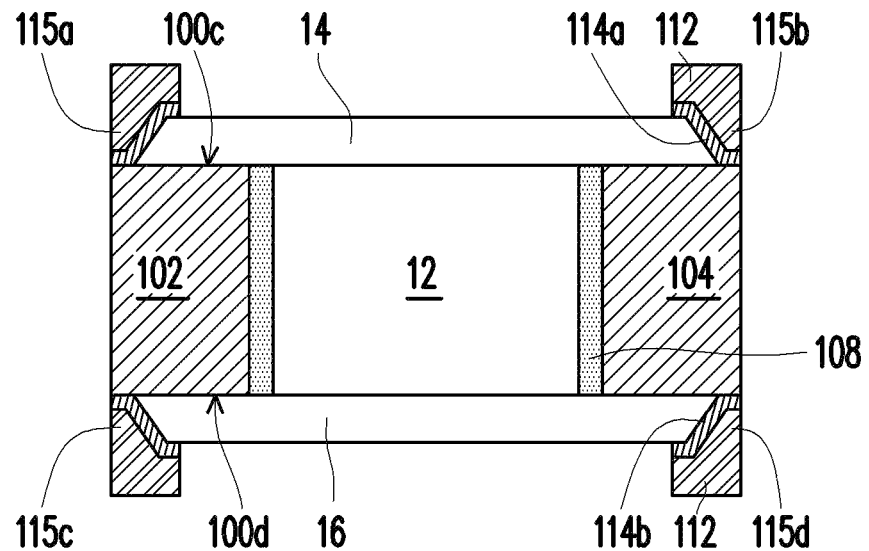
FIG. 1E illustrates a cross-sectional view along line C-C' of FIG. 1B.

Referring to FIG. 1E, a cross-sectional view along line C-C' of FIG. 1B is illustrated. The upper insulation layer 14 is disposed on the upper surface 100c of the first coil inductor 100 and the lower insulation layer 16 is disposed on the lower surface 100d of the first coil inductor 100. At least one opening 115a and at least one opening 115b are formed in the upper insulation layer 14. At least one opening 115c and at least one opening 115d are formed in the lower insulation layer 16. An upper metallic layer 114a covers the opening 115a and the opening 115b of the upper insulation layer 14. A lower metallic layer 114b covers the opening 115c and the opening 115d of the lower insulation layer 16. The conductive elements 112 are electrically connected to the upper metallic layer 114a and the lower metallic layer 114b. In addition, the conductive elements 112 are electrically connected to the upper metallic layer 114a and the lower metallic layer 114b.

Because the coil inductors 100 and 200 extend through the substrate 12, the cross-sectional areas of the coil inductors 100 and 200 are larger than other types of coils designed on the surface of the substrate 12. A larger cross-section area may further be achieved by adjusting the aspect ratio of coil inductors 100 and 200. For example, coil inductors 100 and 200 may be taller than they are wide, thus having an aspect ratio greater than one, such as: at least about 1.5, at least about 2, or at least about 3. A larger cross-section area provides for reduced direct current (DC) resistance, as seen in Equation (2), where R is resistance, A is cross-sectional area, l is the length of the coil, and ρ is the electrical resistivity of the material.

$$R=\rho*l/A \quad \text{Equation (2)}$$

Equation (2) illustrates that the cross-sectional area (A) is inversely proportional to the DC resistance (R) if the electrical resistivity of the material (ρ) and the length of the coil (l) are constant. For this reason, the embedded transformer 10 has a reduced DC resistance due to the larger cross-sectional area of the first coil inductor 100 and the second coil inductor 200. In addition, smaller DC resistance can help to improve high current handling capability; therefore the described transformer provides good thermal dissipation due to the larger cross-sectional area of the coil inductors 100 and 200.

Figure 2:
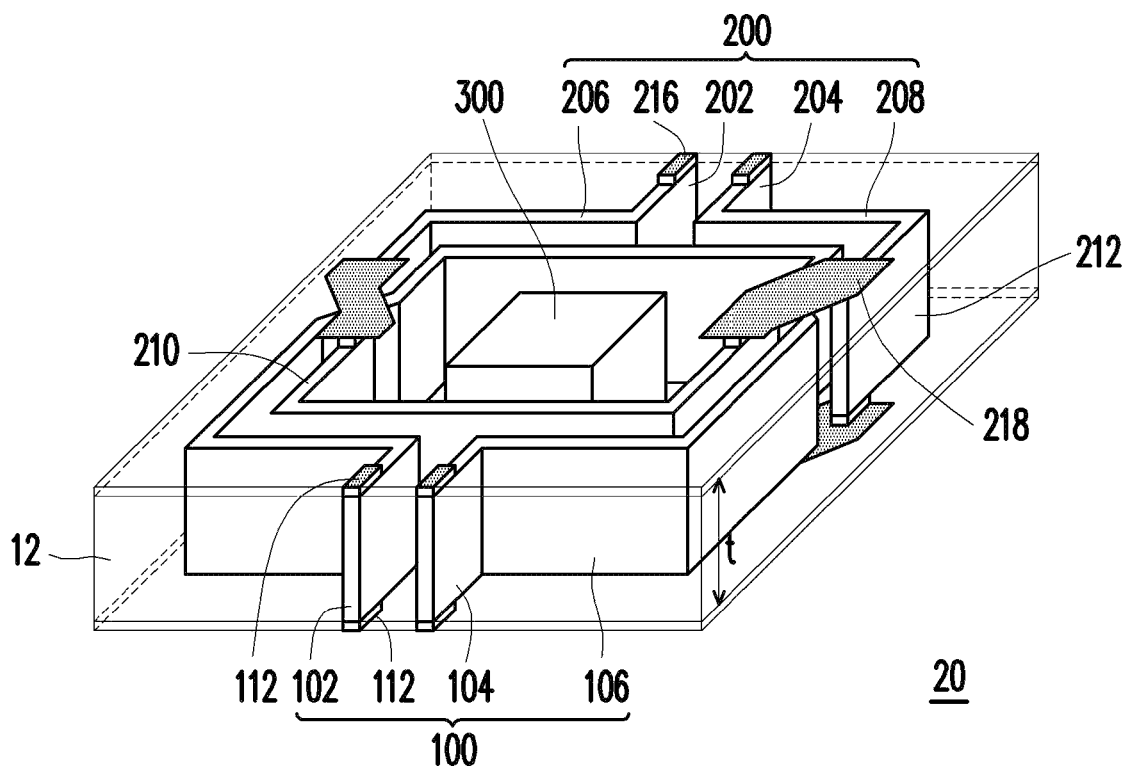
FIG. 2 illustrates a three-dimensional perspective view of a semiconductor transformer according to one alternate embodiment.

Referring to FIG. 2, a three-dimensional view of a semiconductor transformer 20 according to an alternate embodiment is illustrated. The semiconductor transformer 20 includes a core block element 300 located within the first coil 106 and within the space defined by the second segment 210 and the first coil 106.

The first coil inductor 100 and the second coil inductor 200 may be different materials. For embodiments in which one or both of the first coil inductor 100 and the second coil inductor 200 are formed in segments, the segments may be composed of different materials. Materials used for the first coil inductor 100, or segments thereof, and the second coil inductor 200, or segments thereof, may include a metal, such as copper, for example. The material of the core block element 300 is selected based at least part on its resistivity and/or permeability. For example, the core block element 300 may be a ferrite, nickel, or iron. The core block element 300 can be made of a highly permeable material, which helps to increase the inductance and improve the lower frequency Q-factor performance. The frequency Q-factor is proportional to the inductance L, as illustrated by Equation (3)

$$Q = \frac{1}{R}\sqrt{\frac{L}{C}} \quad \text{Equation (3)}$$

Equation (4) illustrates that inductance L is related to the relative permeability of the material within the core block 300.

$$L = \frac{\mu_0 \mu_r}{4\pi} \int_S \int_{\delta S} \frac{dl \times \hat{r}}{r^2} \cdot dA \quad \text{Equation (4)}$$

Thus, the inductance L may be increased by the choice of $\mu_r$. Therefore, the formula shows the inductance L is proportional to the relative permeability of the material within the inductor $\mu_r$ and the frequency Q-factor is proportional to the inductance L. For this reason, the high permeability material of core block element 300 can improve the frequency Q-factor.

In the embodiment illustrated by the semiconductor transformer 20, the height of the core block element 300 is substantially the same as a trench depth, while the trench depth is substantially the same as the thickness of the silicon substrate 12. Trenches and trench depth are described below with respect to FIG. 5A. Although the shape of the core block element 300 is shown as square in FIG. 2, the shape of the core block element 300 is not limited to be square but can be round, rectangular, strip or polygonal, for example. Further, although one core block element 300 is illustrated in FIG. 2, in some embodiments there may be multiple core block elements 300.

An ideal transformer would have no energy losses, and would be 100% efficient. In practical transformers, energy is dissipated in the windings, core, and surrounding structures. A source of energy loss is "eddy currents" that circulate within the core. Eddy currents may be reduced by making multiple core block elements 300 electrically insulated from each other, rather than a solid core block element 300.

Figure 3A:
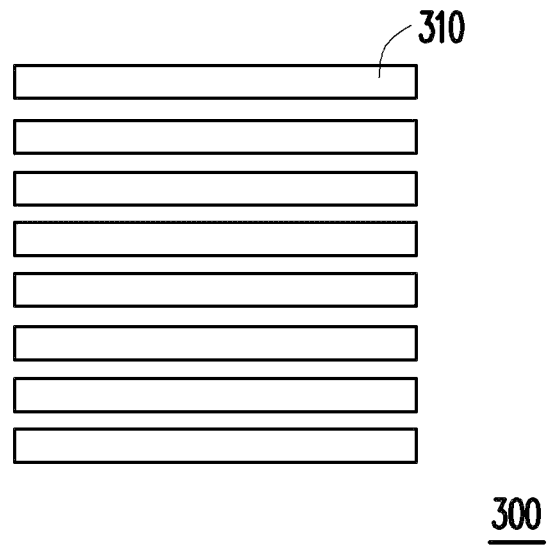
FIG. 3A illustrates a top view of a core block of a semiconductor transformer according to one embodiment.

Referring to FIG. 3A, a top view of a core block element 300 with multiple block segments 310 is illustrated. The block segments 310 are arranged in a column in this embodiment.

Figure 3B:
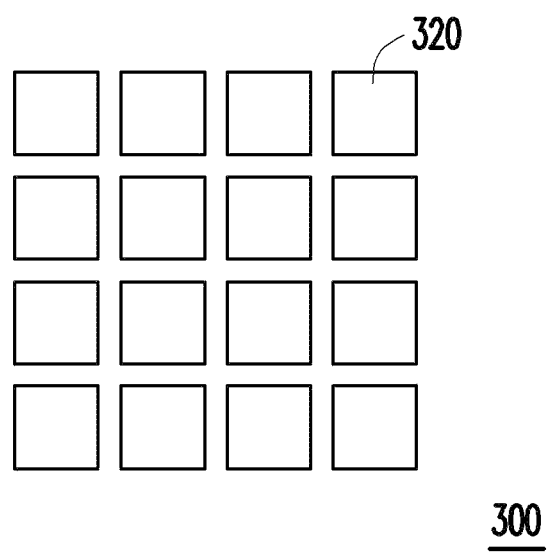
FIG. 3B illustrates a top view of a core block of a semiconductor transformer according to an alternate embodiment.

Referring to FIG. 3B, a top view of a core block element 300 with multiple block segments 320 is illustrated. The block segments 320 are square in shape and arranged in an array in this embodiment.

Figure 3C:
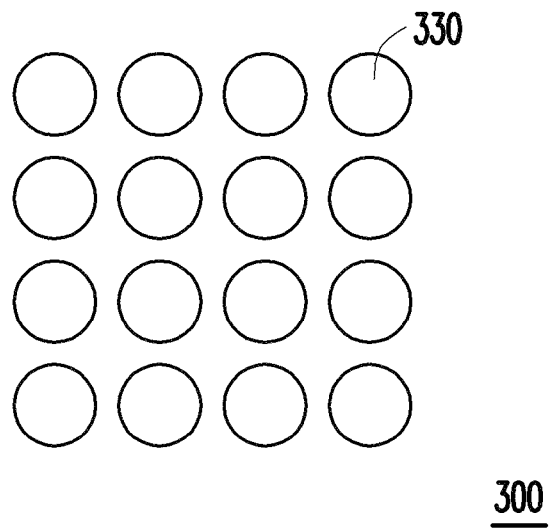
FIG. 3C illustrates a top view of a core block of a semiconductor transformer according to an alternate embodiment.

Referring to FIG. 3C, a top view of a core block element 300 with multiple block segments 330 is illustrated. The block segments 330 are round in shape and arranged in an array in this embodiment.

Figure 3D:
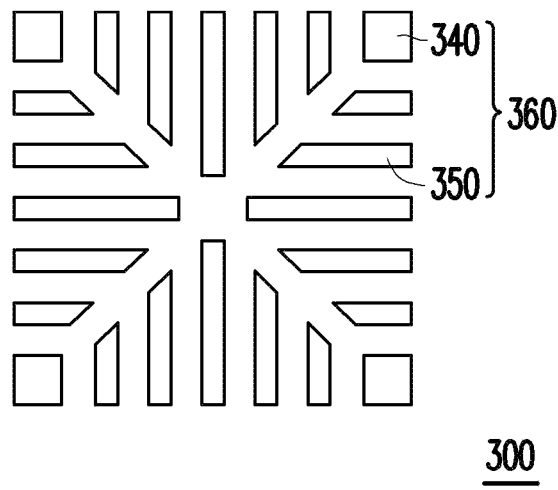
FIG. 3D illustrates a top view of the core block of the semiconductor transformer according to an alternate embodiment.

In FIG. 3D, a top view of a core block element 300 is illustrated as including multiple square block segments 340 and multiple strip block segments 350. The square block segments 340 and the strip block segments 350 are arranged to form a specific branch pattern 360 in this embodiment. The specific branch pattern 360 can, at least in part, reduce eddy-current losses.

Figure 4:
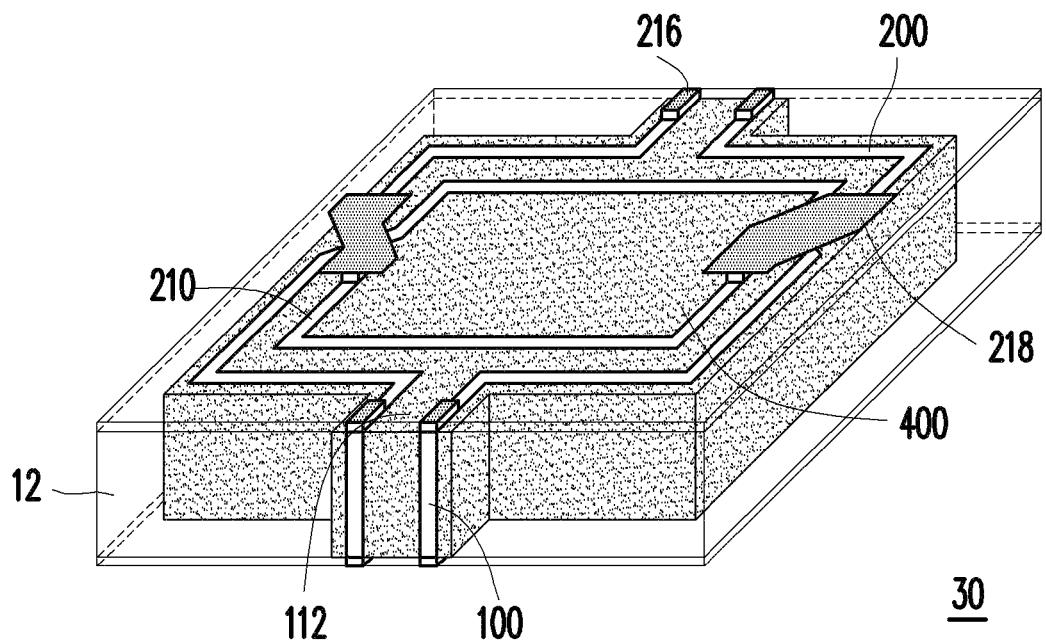
FIG. 4 illustrates a three-dimensional view of a semiconductor transformer according to an alternate embodiment.

Referring to FIG. 4, a three-dimensional view of a semiconductor transformer 30 according to an alternate embodiment is illustrated. The semiconductor transformer 30 includes an isolation block element 400. The material of the isolation block element 400 is selected based at least part on its resistivity and/or dielectric constant. The isolation block element 400 is made of a material with a smaller dielectric constant relative to silicon dioxide (i.e., "low-k"), such as Fluorine-doped silicon dioxide, Carbon-doped silicon dioxide, porous silicon dioxide, Polyimide, and Benzocyclobutene, for example. The dielectric constant of silicon dioxide is about 3.9. Fluorine-doped silicon dioxide is a silicon dioxide doped with fluorine to produce fluorinated silica glass, with a dielectric constant of about 3.5. Carbon-doped silicon dioxide is a silicon dioxide doped with carbon, with a dielectric constant of about 3. Porous silicon dioxide is a silicon dioxide with large voids or pores. Voids can have a dielectric constant of nearly 1, thus the dielectric constant of porous silicon dioxide may be about 2.

Based on the formula C=∈A/d, parasitic capacitance (C) is proportional to permittivity (∈) if other parameters are constant. Thus, because dielectric constant is proportional to permittivity, the low-k isolation block element 400 can reduce parasitic capacitance. Furthermore, Equation (5) illustrates that the self-resonance frequency (f) is inversely proportional to the parasitic capacitance (C) if others parameters are constant.

$$f = \frac{1}{2\pi\sqrt{LC}}$$ Equation (5)

Thus, reduced parasitic capacitance can raise the self-resonance frequency. Additionally, Q-factor performance is proportional to the self-resonance frequency. The low-k isolation block element 400 can reduce the parasitical capacitance, raise the self-resonance frequency and thus improve the high frequency Q-factor performance.

The first coil inductor 100 and the second coil inductor 200 of the semiconductor transformer 30 are embedded within the low-k isolation block element 400. The low-k isolation block element 400 electrically isolates the first coil inductor 100 and the second coil inductor 200 from each other without the need for forming additional insulation layer thereon. Thus, the low-k isolation block element 400 can replace a portion of the substrate 12.

In some implementations, a core (not shown) such as a core block element 300 may also be included in a transformer 30. A core may be, for example, situated in a void in the isolation block element 400. A void may be formed within the first coil inductor 100 and within a space defined by portions of the first coil inductor 100 and the second coil inductor 200.

In FIGS. 5A-5M, a process of manufacturing an example transformer is illustrated. Similar processes may be used to manufacture the transistors of FIG. 1A, FIG. 2 and FIG. 4.

Figure 5A:
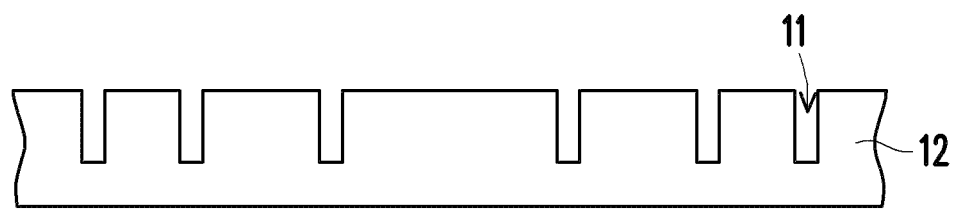
FIGS. 5A-5M illustrate one method of manufacturing the semiconductor transformer of FIG. 1.

Referring to FIG. 5A, multiple trenches 11 are formed in the substrate 12. The substrate 12 is, for example, a silicon wafer having a thickness more than about 100 microns. The depth of the trench 11 is smaller than the original thickness of the substrate 12.

Figure 5B:

Referring to FIG. 5B, a first metal layer 13 is disposed on the substrate 12 and fills the trenches 11. The first metal layer 13 may be formed by a sputtering process, and includes such materials as TiCu and aluminum, for example. However, it should be appreciated that the first metal layer 13 is not limited to the material disclosed above.

Figure 5C:
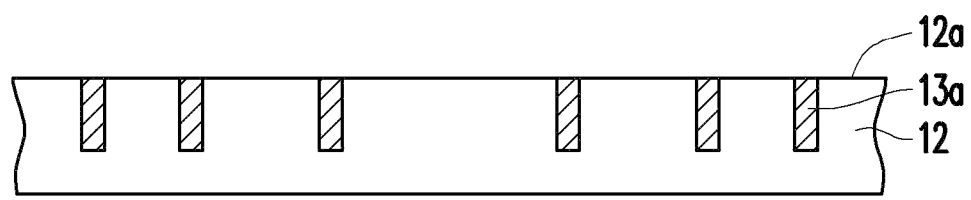

Referring to FIG. 5C, a first planarization process is performed to remove the first metal layer 13 above the trenches 11 to form multiple metal rails 13a, and the top surface 12a of the substrate 12 is exposed. The planarization process may be a chemical mechanical polishing process, for example. The metal rails 13a correspond to the first coil inductor 100 and the second coil inductor 200 of the semiconductor transformer 10 in this embodiment. In this embodiment, the first coil inductor 100 and the second coil inductor 200 are formed simultaneously.

Figure 5D:
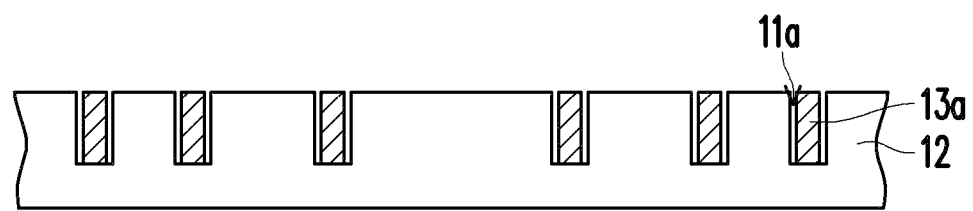

Referring to FIG. 5D, multiple gaps 11a are formed along the sidewalls of the metal rails 13a in the substrate 12 by an etching process, such as wet-etching or dry-etching.

Figure 5E:
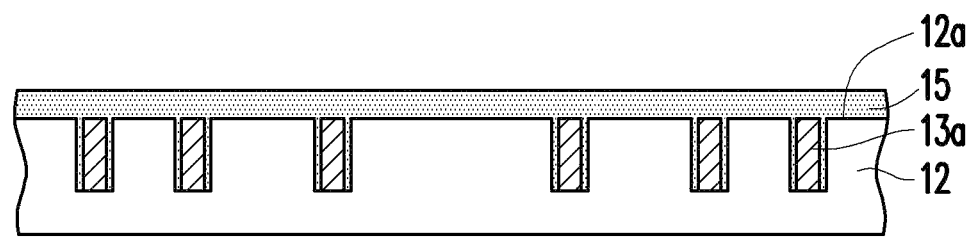

Referring to FIG. 5E, a first insulating layer 15 is disposed on the top surface 12a of the substrate 12 to fill the gaps 11a. The material of the first insulating layer 15 may be a polymer material, for example.

Figure 5F:
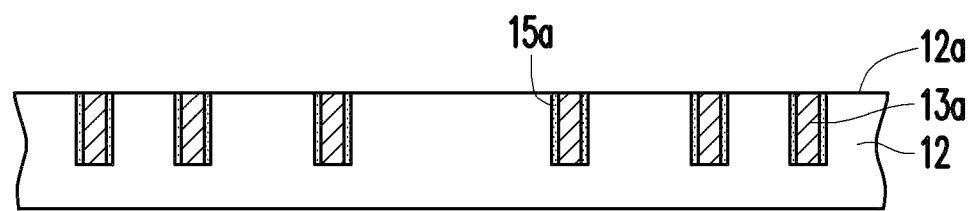

Referring to FIG. 5F, a second planarization process is performed to remove the first insulating layer 15 above the upper surface 12a of the substrate 12, thereby forming multiple insulating elements 15a between the sidewalls of the metal rails 13a and the substrate 12. Top surfaces of the metal rails 13a and the insulating elements 15a are exposed at the upper surface 12a.

Figure 5G:
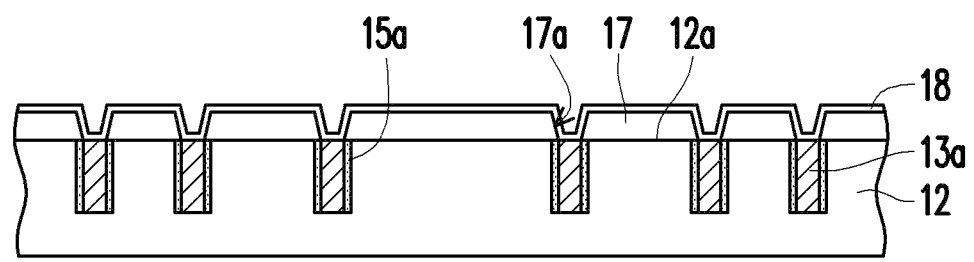

Referring to FIG. 5G, a second insulating layer 17 is disposed on the top surface 12a of the substrate 12. Multiple openings 17a are formed in the second insulating layer 17 that expose certain upper surfaces of the metal rails 13a. A first seeding layer 18 is formed to conformally cover the second insulating layer 17. The material of the second insulating layer 17 may be a polymer material, for example.

Figure 5H:
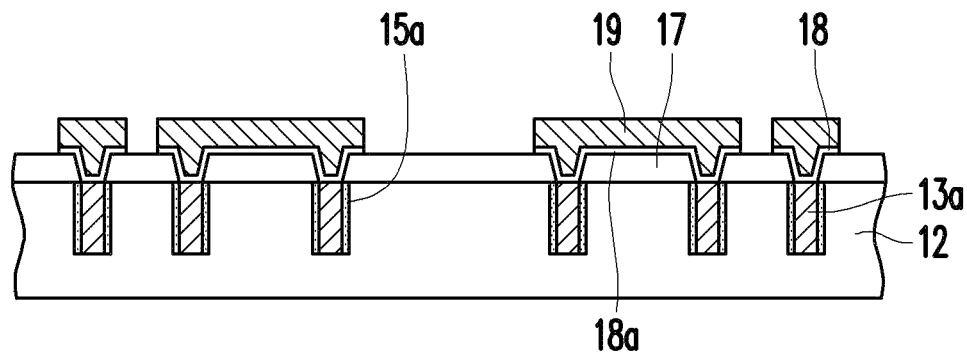

Referring to FIG. 5H, multiple first conductive elements 19 are disposed on the first seeding layer 18 over the openings 17a. The first seeding layer 18 which is not covered by the first conductive elements 19 is then partially removed by etching process, such as wet etching or dry etching. Conductive elements 218 formed on a first surface of transformer 10, 20 and 30 of FIG. 1A, FIG. 2 and FIG. 4, respectively, may be formed in similar manner to conductive elements 19 of FIG. 5H.

Figure 5I:
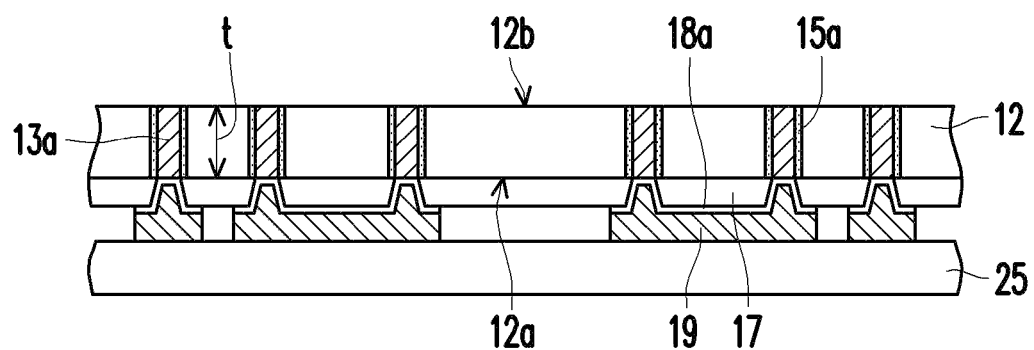

Referring to FIG. 5I, the substrate 12 is overturned and attached to a carrier 25. A thinning process is performed on a bottom surface 12b of the substrate 12 until the metal rails 13a are exposed. That is, the substrate 12 is thinned to have a thickness "t" substantially the same as the trench depth. The top surface 12a of the substrate 12 now faces downward.

Figure 5J:
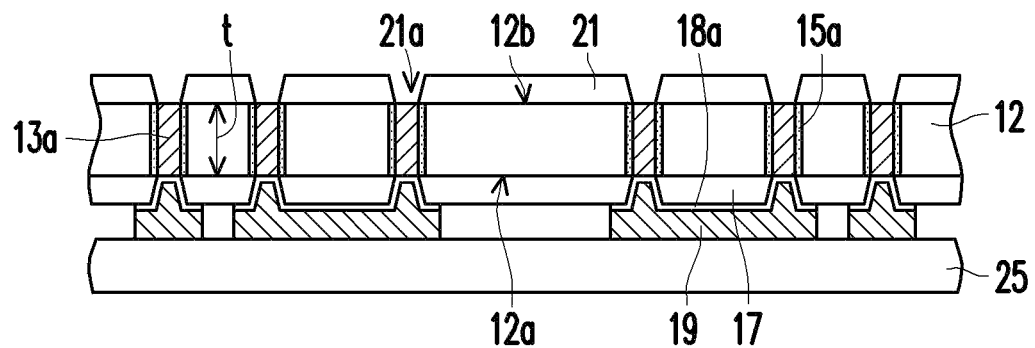

Referring to FIG. 5J, a third insulating layer 21 is disposed on the bottom surface 12b of the substrate 12. The third insulating layer 21 has multiple openings 21a that expose certain locations of the metal rails 13a. The material of the third insulating layer 21 may be a polymer material, for example.

Figure 5K:
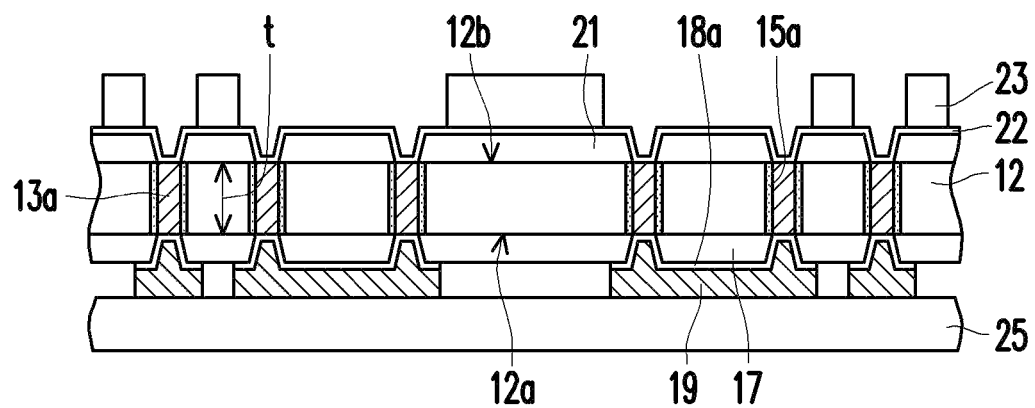

Referring to FIG. 5K, a second seeding layer 22 is disposed conformally on the third insulating layer 21. Then a patterned photoresist layer 23 is formed on the second seeding layer 22.

Figure 5L:
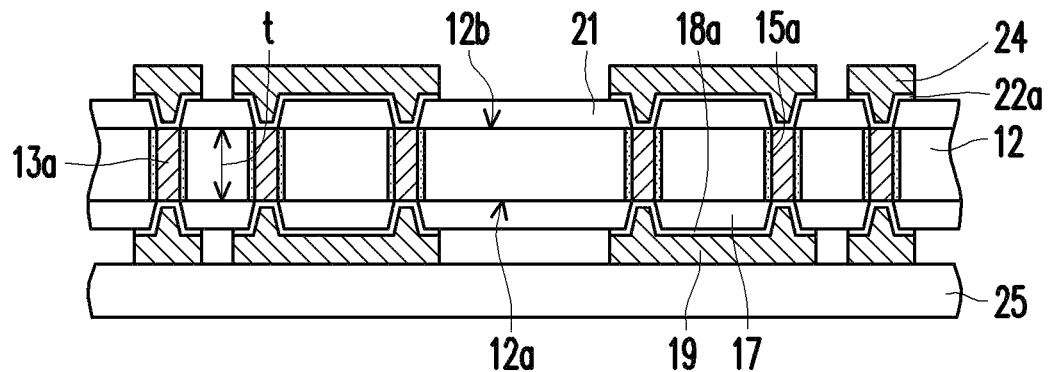

Referring to FIG. 5L, multiple second conductive elements 24 are formed on the second seeding layer 22 and covers the openings 21a. Then, the second seeding layer 22 which is not covered by the second conductive element 24 is partially removed by an etching process, such as wet etching or dry etching. Subsequently, the patterned photoresist layer 23 is stripped. Conductive elements 218 formed on a second surface of transformer 10, 20 and 30 of FIG. 1A, FIG. 2 and FIG. 4, respectively, may be formed in similar manner to conductive elements 24 of FIG. 5L. Thus, conductive elements 19 and 24 in FIG. 5L can correspond to the elements 218 shown on an upper and lower surface of transformers 10, 20 and 30 of FIG. 1A, FIG. 2 and FIG. 4, respectively.

A core block, such as core block element 300 illustrated in FIGS. 2 and 3A-3D, may be formed by creating a void in the substrate 12 and filling the void with a core material (not illustrated). For example, a void may be created for a core block during the trenching process illustrated in FIG. 5A, or one or more process operations may be included at some other point at which the substrate 12 is exposed. A void may be created through a mask and etch process, or through a drilling process, for example. Subsequently, a core material may be, for example, deposited in a single layer or in multiple layers having potentially different material compositions in different layers. For multi-segment cores such as those illustrated in FIGS. 3A-3D, the segments may be formed in a pattern, or alternatively may be formed as a solid piece and subsequently patterned using conventional techniques.

Figure 5M:
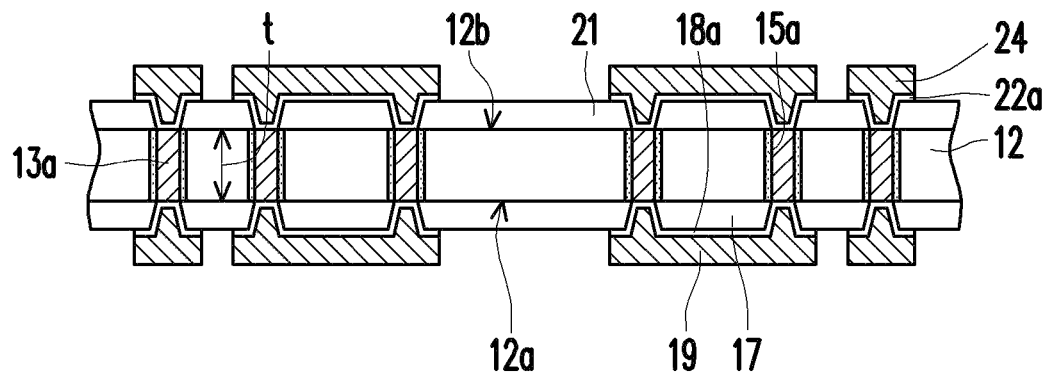

Referring to FIG. 5M, the carrier 25 is removed from the substrate 12 and the semiconductor transformer 10 is obtained.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt to a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor transformer device, comprising:
a substrate;
a first coil inductor embedded in the substrate, including a first port, a second port and a contiguous first coil inductor wall;
a second coil inductor embedded in the substrate, including a third port, a first extension wall connected to the third port, a fourth port, a second extension wall connected to the fourth port and a second coil inductor wall;
a first conductive element extending between and electrically connecting the second coil inductor wall and the first extension wall;
a second conductive element extending between and electrically connecting a top side of the second coil inductor wall and the second extension wall; and
a third conductive element extending between a bottom side of the second coil inductor wall and the second extension wall;
wherein the first coil inductor wall extends through a gap between the second coil inductor wall and the first extension wall and a gap between the second coil inductor wall and the second extension wall;
wherein the first coil inductor wall has a substantially uniform height substantially equal to a thickness of the substrate; and
wherein the first extension wall, the second extension wall, and the second coil inductor wall have a substantially uniform height substantially equal to the thickness of the substrate.

2. The semiconductor transformer device of claim 1, wherein the first coil inductor wall is a ring-shaped structure with an opening disposed between the first port and the second port.

3. The semiconductor transformer device of claim 1, wherein the second coil inductor wall is disposed within the first coil inductor, and the first extension wall and the second extension wall are disposed outside the first coil inductor.

4. The semiconductor transformer device of claim 1, further comprising an insulation layer covering sidewalls of the first coil inductor and the second coil inductor.

5. The semiconductor transformer device of claim 1, further comprising at least one core block element disposed within the first coil inductor wall.

6. The semiconductor transformer device of claim 5, wherein the core block element includes a plurality of discrete segments.

7. A semiconductor transformer device, comprising:
a substrate;
a first coil inductor including a first terminus, a second terminus and a first coil inductor panel;
a second coil inductor disposed in a spaced relationship relative to the first coil inductor, the second coil inductor including a third terminus, a first extension panel connected to the third terminus, a fourth terminus, a second extension panel connected to the fourth terminus and a second coil inductor panel; and
a plurality of conductive elements connecting the first extension panel to the second coil inductor panel, including a first conductive element positioned at an upper surface of the second coil inductor panel, and a second conductive element positioned at a lower surface of the second coil inductor panel;
wherein the first conductive element extends between and electrically connects the second coil inductor panel and the first extension panel, the second conductive element extends between and electrically connects the second coil inductor panel and the first extension panel, and the first coil inductor panel extends through a gap between the second coil inductor panel and the first extension panel and a gap between the second coil inductor panel and the second extension panel;
wherein the first coil inductor panel, the first extension panel, the second extension panel, and the second coil inductor panel have a substantially uniform height substantially equal to a thickness of the substrate.

8. The semiconductor transformer device of claim 7, wherein the first coil inductor panel is a ring-shaped structure with an opening between the first terminus and the second terminus.

9. The semiconductor transformer device of claim 7, further comprising at least one core block element disposed within the first coil inductor panel.

10. A semiconductor transformer device, comprising:
a first inductor structure formed as a solid conductive perimeter around a part of a first volume; and
a second inductor structure formed of a plurality of portions, the portions connected to form a conductive perimeter around a part of a second volume;
wherein the plurality of portions of the second inductor structure are connected with conductive material to form the conductive perimeter, such that the first inductor structure and the second inductor structure are interlaced;
wherein at least two of the plurality of portions of the second inductor structure are connected with the conductive material at a top side and at a bottom side of the second inductor structure;
wherein the first volume and the second volume overlap; and
wherein the first inductor structure and the plurality of portions of the second inductor structure have a substantially uniform height substantially equal to a thickness of a substrate in which the first inductor structure and the plurality of portions of the second inductor structure are embedded.

11. The semiconductor transformer device of claim 10, wherein at least one portion of the second inductor structure is internal to the first volume, and at least two portions of the second inductor structure are external to the first volume.

12. The semiconductor transformer device of claim 11, wherein each of the at least two portions of the second inductor structure external to the first volume terminates at a respective port.

13. The semiconductor transformer device of claim 10, wherein the first inductor structure includes two distal ends, and each distal end terminates at a respective port.

* * * * *